United States Patent
Schneegans et al.

(10) Patent No.: US 6,596,625 B2
(45) Date of Patent: Jul. 22, 2003

(54) METHOD AND DEVICE FOR PRODUCING A METAL/METAL CONTACT IN A MULTILAYER METALLIZATION OF AN INTEGRATED CIRCUIT

(75) Inventors: Martin Schneegans, Vaterstetten (DE); Stephan Wege, Weissig (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/932,899

(22) Filed: Aug. 20, 2001

(65) Prior Publication Data

US 2002/0022342 A1 Feb. 21, 2002

(30) Foreign Application Priority Data

Aug. 18, 2000 (DE) .......................................... 100 40 465

(51) Int. Cl.[7] .......................................... H01L 21/4763
(52) U.S. Cl. ...................................... 438/622; 438/633
(58) Field of Search ................................ 438/453, 706, 438/710, 725, 723, 622, 633, 597, 738; 257/758–759

(56) References Cited

U.S. PATENT DOCUMENTS

| | | | |
|---|---|---|---|
| 5,266,521 A | * 11/1993 | Lee et al. | 438/632 |
| 5,661,083 A | 8/1997 | Chen et al. | |
| 5,817,579 A | 10/1998 | Ko et al. | |
| 5,843,843 A | * 12/1998 | Lee et al. | 438/688 |
| 5,851,917 A | * 12/1998 | Lee | 438/627 |
| 6,013,574 A | * 1/2000 | Hause et al. | 438/622 |
| 6,025,255 A | 2/2000 | Chen et al. | |
| 6,057,081 A | * 5/2000 | Yunogami et al. | 216/41 |
| 6,077,768 A | * 6/2000 | Ong et al. | 438/622 |
| 6,147,003 A | * 11/2000 | Tabara et al. | 438/704 |
| 6,147,007 A | 11/2000 | Yang et al. | |
| 6,180,531 B1 | * 1/2001 | Matsumoto et al. | 438/706 |
| 6,187,689 B1 | * 2/2001 | Tabara | 438/636 |
| 6,194,128 B1 | * 2/2001 | Tao et al. | 430/313 |
| 6,323,121 B1 | * 11/2001 | Liu et al. | 430/314 |

FOREIGN PATENT DOCUMENTS

WO        WO 00/55903        9/2000

* cited by examiner

Primary Examiner—David Nelms
Assistant Examiner—David Vu
(74) Attorney, Agent, or Firm—Laurence A. Greenberg; Werner H. Stemer; Ralph E. Locher

(57) ABSTRACT

Metal/metal contacts are formed as part of a multilayer metallization in an integrated circuit on a semiconductor wafer. The application of an insulation layer on a metal level is followed by a lithography step using a photoresist mask to define contact holes on the insulation layer, followed by anisotropic etching of the insulation layer in order to produce the contact holes. Then, a chemical dry etch that removes the photoresist mask and a chemical-physical dry etch that removes organic impurities which accumulate during the chemical dry etch are successively carried out in a vacuum. Subsequently, a metal deposition step is carried out in order to fill the contact holes.

5 Claims, 11 Drawing Sheets

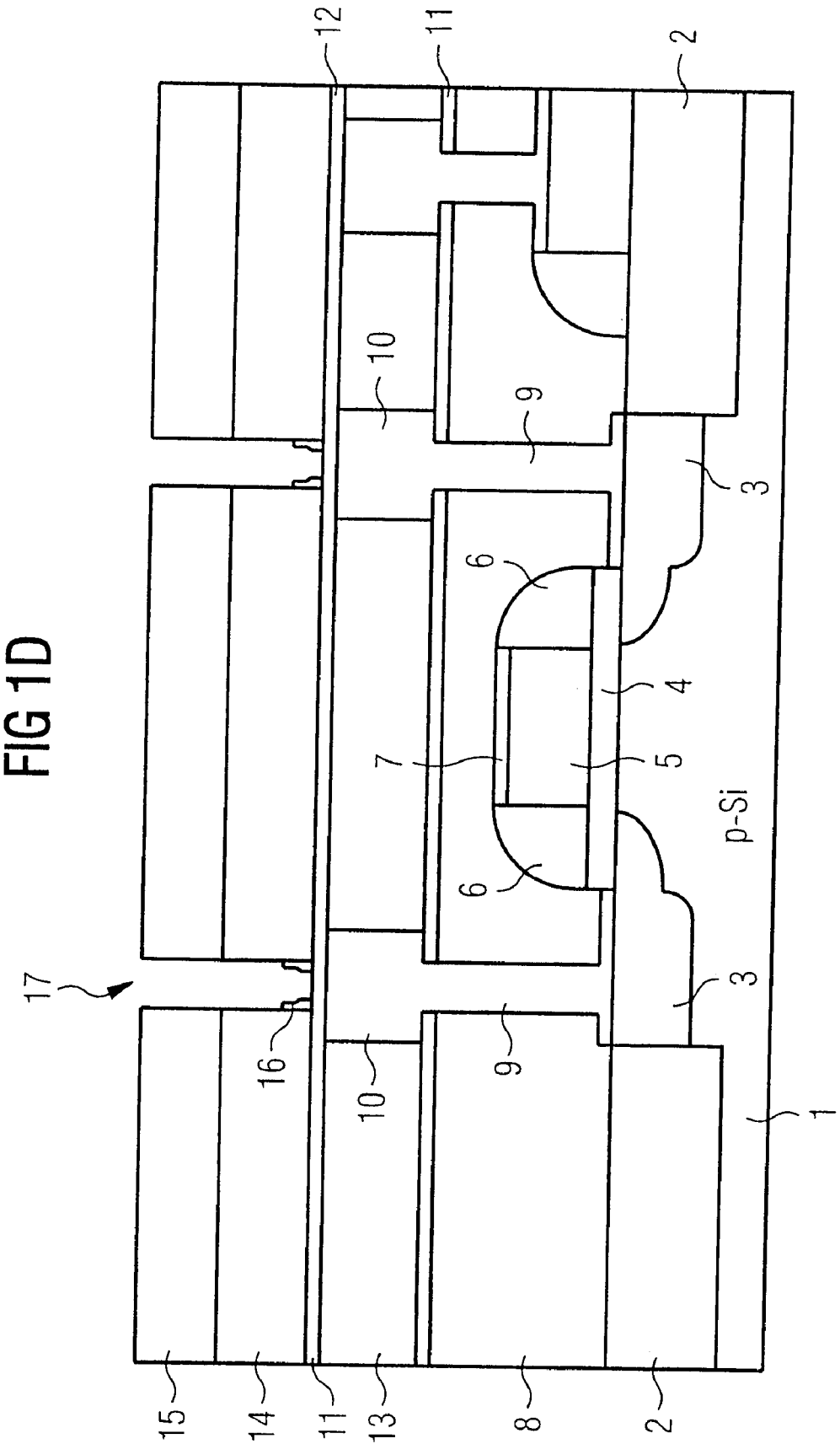

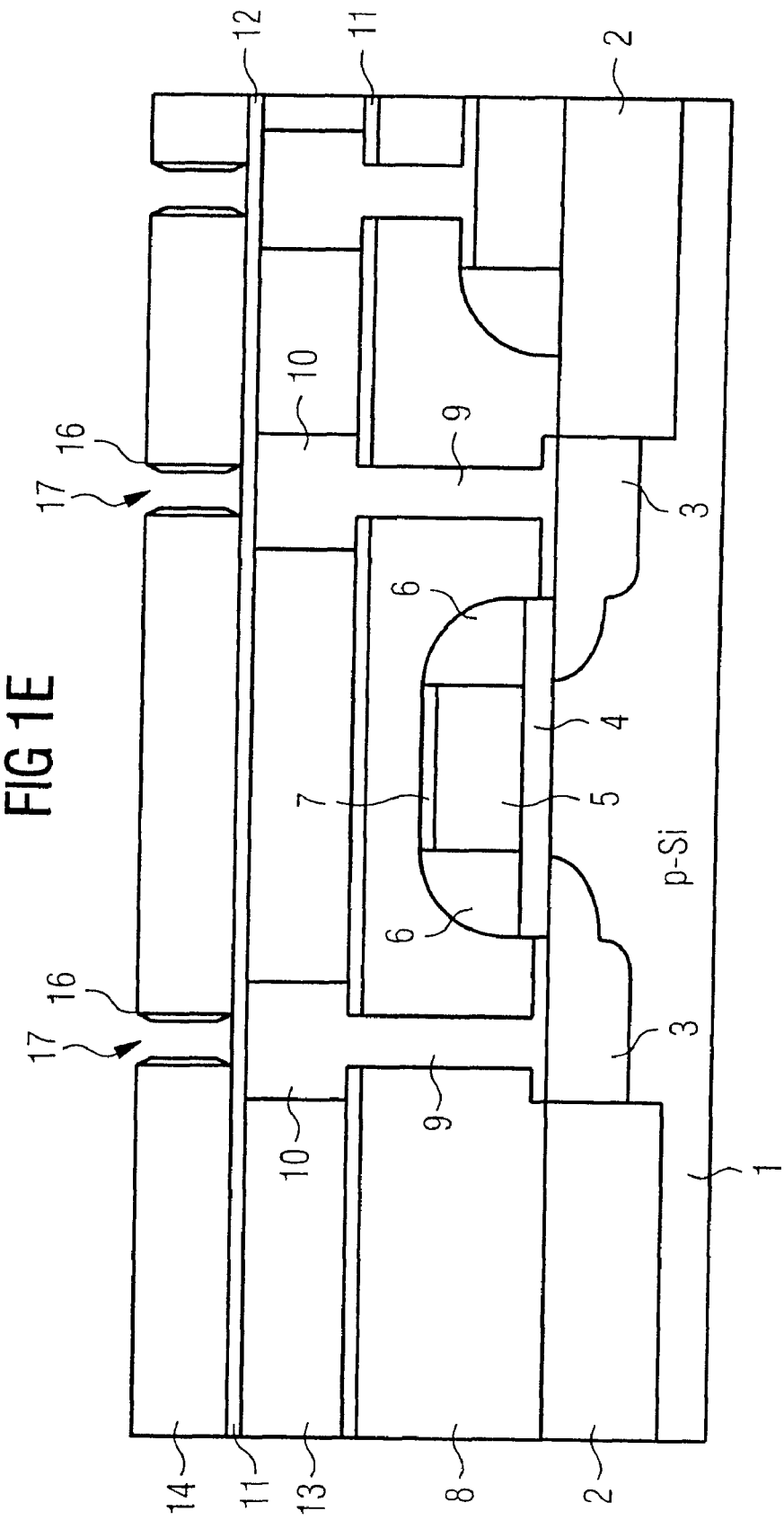

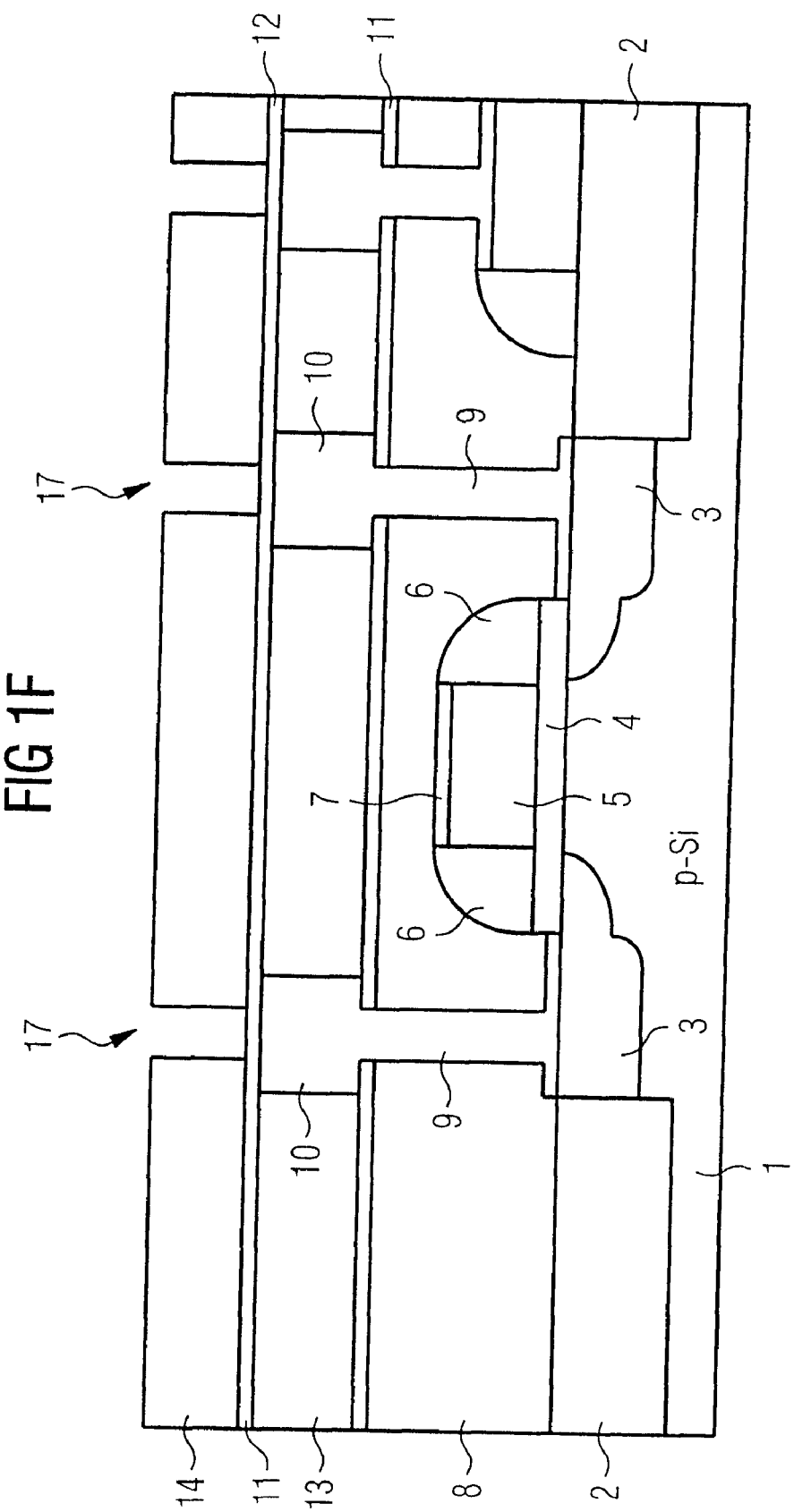

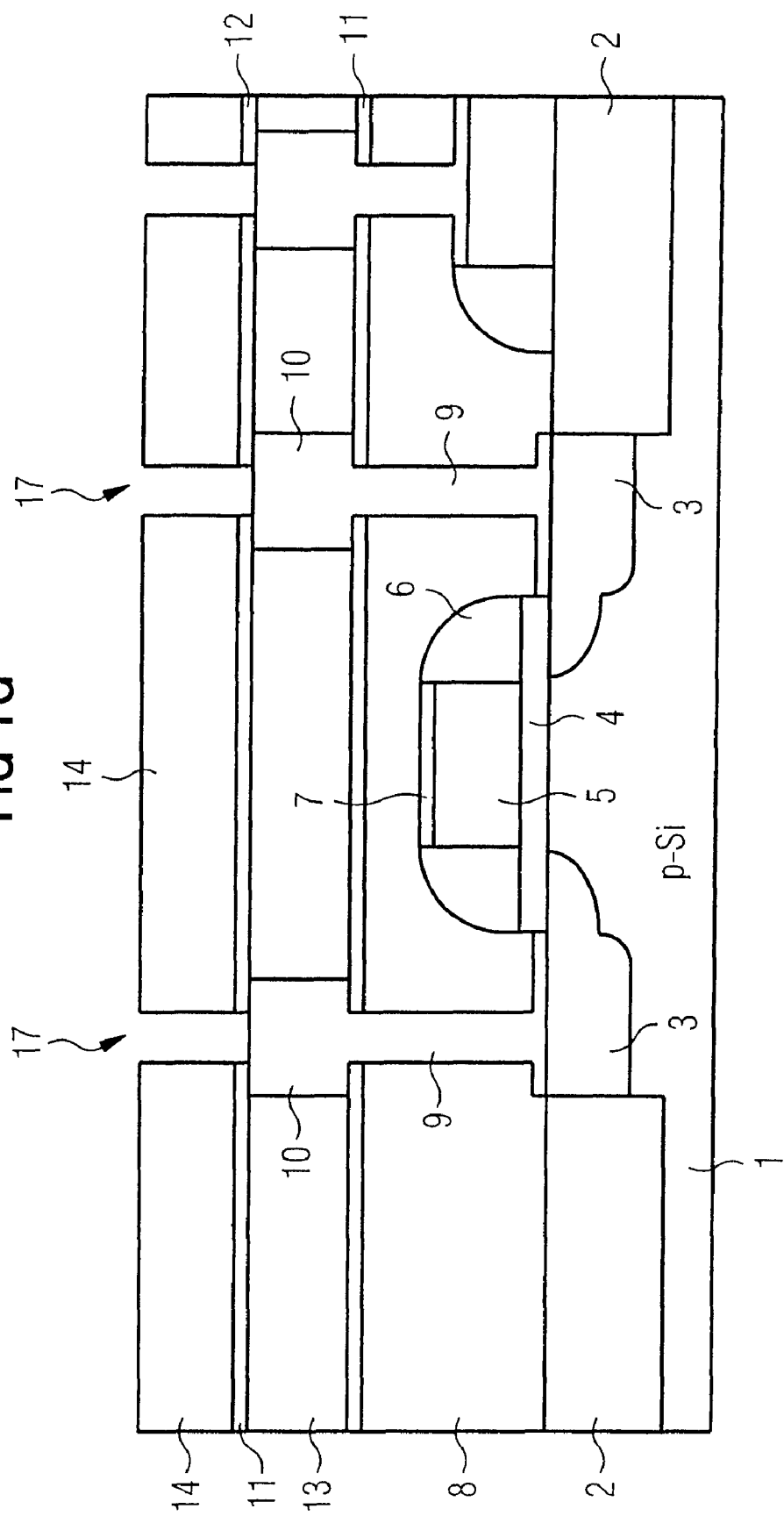

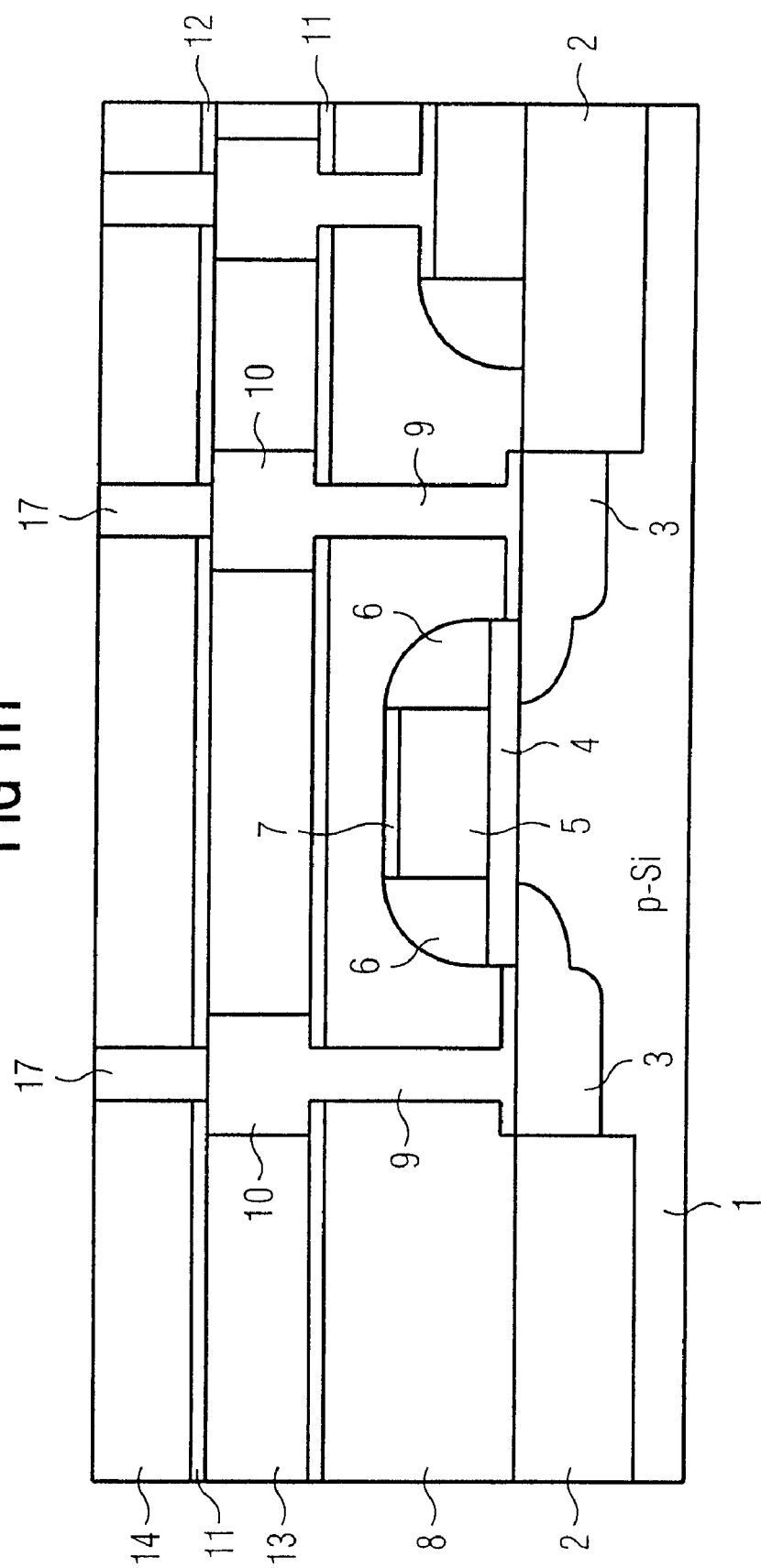

FIG 2

| Process | Method | Standard process sequence | Integrated process sequence |
|---|---|---|---|
| Via etching | Plasma etching | Plasma (stop at nitride liner) | Plasma (stop at nitride liner) |
| Resist stripping | Plasma etching | Plasma | |
| Nitride etching | Plasma etching | MERIE | Integrated preliminary process (with nitride liner etching) |
| Copper deposition | Plasma deposition (Multichamber installation) | Preheating | |
| | | Ar sputter cleaning | |
| | | Ta deposition | Ta deposition |
| | | TaN deposition | TaN deposition |
| | | Cu deposition | Cu deposition |

FIG 3

| Process | Method | Standard process sequence | Integrated process sequence |
|---|---|---|---|
| Via etching | Plasma etching | Plasma | Plasma |
| Resist stripping | Plasma etching | Plasma | Integrated preliminary process |
| Wet cleaning | Wet-chemical | EKC (DD)<br>ACT (TAI)<br>NOE (WOS)<br>DSP (EFK) | |
| Aluminium deposition | Plasma deposition<br>(Multichamber installation) | Preheating | |
| | | Ar sputter cleaning | |
| | | Ti deposition | Ti deposition |
| | | AlCu deposition | AlCu deposition |
| | | TiN deposition | TiN deposition |

METHOD AND DEVICE FOR PRODUCING A METAL/METAL CONTACT IN A MULTILAYER METALLIZATION OF AN INTEGRATED CIRCUIT

BACKGROUND OF THE INVENTION

FIELD OF THE INVENTION

The invention lies in the semiconductor technology field and pertains, more specifically, to a method for producing a metal/metal contact as part of a multilayer metallization in an integrated circuit on a semiconductor wafer and to a device for carrying out preliminary processes as part of producing metal/metal contacts during a multilayer metallization in an integrated circuit on a semiconductor wafer.

During the wiring of circuit elements in an integrated circuit on a semiconductor wafer, techniques have been developed for wiring in a plurality of superposed levels, leading to a savings in chip surface area and to a reduction in the interconnect lengths. In the case of silicon-based integrated circuits, the metals aluminum and copper are primarily used for the metallization, since, on account of their low resistivity, they allow high current intensities. For the multilayer wiring of integrated circuits, the metal levels are arranged above one another, in each case separated from one another by insulation layers, and are connected to one another via contact openings. The latter are known as vias or via openings.

The necessary metal to metal contacts are thereby produced in a customary way using planar technology. For this purpose, an insulation layer, preferably an $SiO_2$ layer, is produced on an interconnect level which has already been formed. Then, a light-sensitive resist is applied, which is then exposed via a mask bearing the pattern of a design level of the contact openings. Then, the exposed resist is removed and the $SiO_2$ layer undergoes anisotropic etching with the aid of a plasma etch. Then, the remaining photoresist mask is removed over the entire surface.

The main component of the photoresists used is predominantly an organic polymer, which can preferably be removed using a plasma-etching step in an oxygen atmosphere. During the plasma etching of the $SiO_2$ layer for the purpose of forming the contact hole and during the subsequent plasma etching of the photoresist mask, however, polymer residues usually accumulate in the etched contact hole and have to be removed prior to a metal deposition for the purpose of filling the contact hole. According to the customary method, the cleaning operation for removing polymer is carried out as a wet-chemical etch, in which the semiconductor wafer is immersed in a chemical bath. However, the wet film, which accumulates on the wafer surface during the wet-chemical etch leads to undesirable oxidation of the metal tracks in the region of the contact opening. Oxidation of this nature is also brought about by the fact that, when the semiconductor wafer is removed from the chemical bath, it generally comes into contact with air.

Therefore, prior to the metal deposition for the purpose of filling up the contact holes, it is necessary to use a further etching step, which is preferably carried out as a dry etch using an argon plasma, to remove the oxide on the metal track in the contact hole. However, this etching process leads to an undesirable roughening of the contact surface and, furthermore, to a high process temperature, which causes difficulties in particular for the deposition of aluminum in order to fill the contact opening.

The risk of oxidation of the metal surface in the contact hole also exists if a thin nitride intermediate layer has been introduced prior to the deposition of the $SiO_2$ layer for insulation of the metal tracks, as is the case in particular for passivation of copper interconnects. This nitride layer on the bottom of the contact holes is, according to the customary procedure, removed after the removal of the polymer residues, preferably by a plasma-etching method. When the semiconductor wafer is transported out of the plasma-etching installation into the metal deposition installation, however, a film of moisture is also formed on the wafer surface, leading to oxidation of openings of the contact holes, so that in this case too oxide has to be removed prior to the deposition of metal.

U.S. Pat. Nos. 5,661,081; 6,025,255; 5,817,579 and 6,013,574 described methods for producing metal/metal contacts as part of a multilayer metallization. There, an insulation layer is applied to a metal level of the semiconductor wafer, then a photolithography step is carried out in order to define the contact holes, the contact holes are produced by anisotropic etching, in a following cleaning process the photoresist mask or organic impurities which form are removed, and finally the contact holes are filled as part of a metal deposition step. In this known method, a layer is formed between the cleaning process for removal of the photoresist mask and the other impurities and the metal deposition step on the bottom of the contact holes, and this layer has to be removed by additional etching prior to the metal deposition.

SUMMARY OF THE INVENTION

It is accordingly an object of the invention to provide a method and a device for forming metal on metal contacts, which overcomes the above-mentioned disadvantages of the heretofore-known devices and methods of this general type and improves the process management for producing metal/metal contacts in integrated circuits on a semiconductor wafer, and in particular to make the process less expensive.

With the foregoing and other objects in view there is provided, in accordance with the invention, a method for producing a metal/metal contact as part of a multilayer metallization in an integrated circuit on a semiconductor wafer. The method comprises the following method steps:

applying an insulation layer to a metal plane;
carrying out a photolithography step using a photoresist mask to define contact holes on the insulation layer;
anisotropically etching the insulation layer to produce contact holes; and
without interrupting the process vacuum:
  removing the photoresist mask by chemical dry etching; and
  removing organic impurities accumulated during the dry etching step by chemical-physical dry etching; and
  depositing metal to fill the contact holes.

In other words, according to the invention, the processes for the production of metal/metal contacts as part of a multilayer metallization in an integrated circuit on a semiconductor wafer are controlled in such a way that, after the application of an insulation layer to a metal level, a lithography step using a photoresist mask is carried out in order to define contact holes on the insulation layer, and then anisotropic etching of the insulation layer is carried out in order to produce the contact holes. Then, in a vacuum, a chemical dry etch, preferably a plasma etch in order to eliminate the photoresist mask, a chemical-physical dry etch, preferably a reactive ion etch in order to eliminate organic impurities which accumulate during the plasma etching, and a metal deposition in order to fill the contact holes are carried out in succession.

With this process management, in which the preliminary processes prior to the metal deposition for filling the contact holes are carried out without interruption to the vacuum, it is possible to eliminate the need for an additional process step in order to remove an oxide layer in the bottom of the contact holes, so that the speed of the process is significantly improved and, furthermore, a cost saving can be achieved. Furthermore, avoiding an additional etching process in order to remove oxide means that the wafer temperature can be kept at a low level prior to filling of the contact holes.

According to the invention, the plasma etch which is used to eliminate the photoresist layer and the reactive ion etch which is used to eliminate organic impurities which accumulate during the plasma etch are carried out in a common vacuum chamber, leading to a considerable cost saving which, furthermore, also saves space in the clean room. Furthermore, it is possible to dispense with additional wafer transport, which would involve the risk of oxidation.

In accordance with an added feature of the invention, the chemical dry etch to eliminate the photoresist mask is carried out with an etching gas excited to form a plasma through application of a high-frequency voltage or by the introduction of microwaves.

In accordance with an additional feature of the invention, the chemical-physical dry etching to eliminate the inorganic impurities is carried out by a reactive ion etching technique.

In accordance with a preferred embodiment of the invention, the etching gas used in the chemical dry etching step is oxygen.

According to one embodiment of the invention, the photoresist mask is isotropically etched away by a plasma-excited gas stream using a chemical dry-etching step, and then the organic impurities, which accumulate are removed using a chemical-physical dry-etching step with ion bombardment. These two etching techniques can be carried out particularly easily in a vacuum chamber using substantially the same equipment.

In accordance with again an additional feature of the invention, the metallization is a copper metallization and, the method further comprises, following the chemical-physical dry etching for eliminating the organic impurities, carrying out a further chemical-physical dry-etching step in the vacuum for removing a nitride layer at a bottom of the contact holes.

In this further preferred embodiment, where copper is used for the metallization, the nitride layer at the bottom of the contact holes is also etched away using a similar chemical-physical dry-etching step as that used to remove the organic impurities, all the etching processes, namely the removal of the photoresist mask, the etching of the organic impurities and the removal of the nitride layer, being carried out in a common vacuum chamber. In this way, equipment costs and the area required in the clean room are considerably reduced. Furthermore, it is possible to dispense with an additional wafer transport process.

With the above and other objects in view there is also provided, in accordance with the invention, a device for producing a metal/metal contact in a multilayer metallization of an integrated circuit on a semiconductor wafer, that is, a device for carrying out the above-summarized method. The device comprises:

a process chamber having a vessel formed with a process-gas inlet, a connection for a vacuum pump, electrodes connected for generating a high frequency and a wafer mount;

the vessel being configured for carrying out, in succession, in a vacuum, a chemical dry etch for removing a photoresist layer, serving as a mask for defining contact holes on an insulation layer arranged on a metal level on a semiconductor wafer, and a chemical-physical dry etch for removing organic impurities in the contact holes accumulating during plasma etching; and the process chamber forming part of an installation for metal deposition, whereby the semiconductor wafer is enabled to be transported out of the vessel and into a metal-deposition reactor without interrupting the vacuum.

Other features which are considered as characteristic for the invention are set forth in the appended claims.

Although the invention is illustrated and described herein as embodied in a novel process management for producing metal/metal contacts, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1A to 1H are diagrammatic sectional view illustrating a process sequence according to the invention for producing metal/metal contacts for an integrated circuit;

FIG. 2 is a tabular chart outlining a comparison of a conventional standard process sequence with an integrated process sequence according to the invention for the production of copper contacts;

FIG. 3 is a tabular chart outlining a comparison of a conventional standard process sequence with an integrated process sequence according to the invention for the production of aluminum contacts.

DETAILED DESCRIPTION OF THE PREFERRED EMBODIMENT

Figure 4:
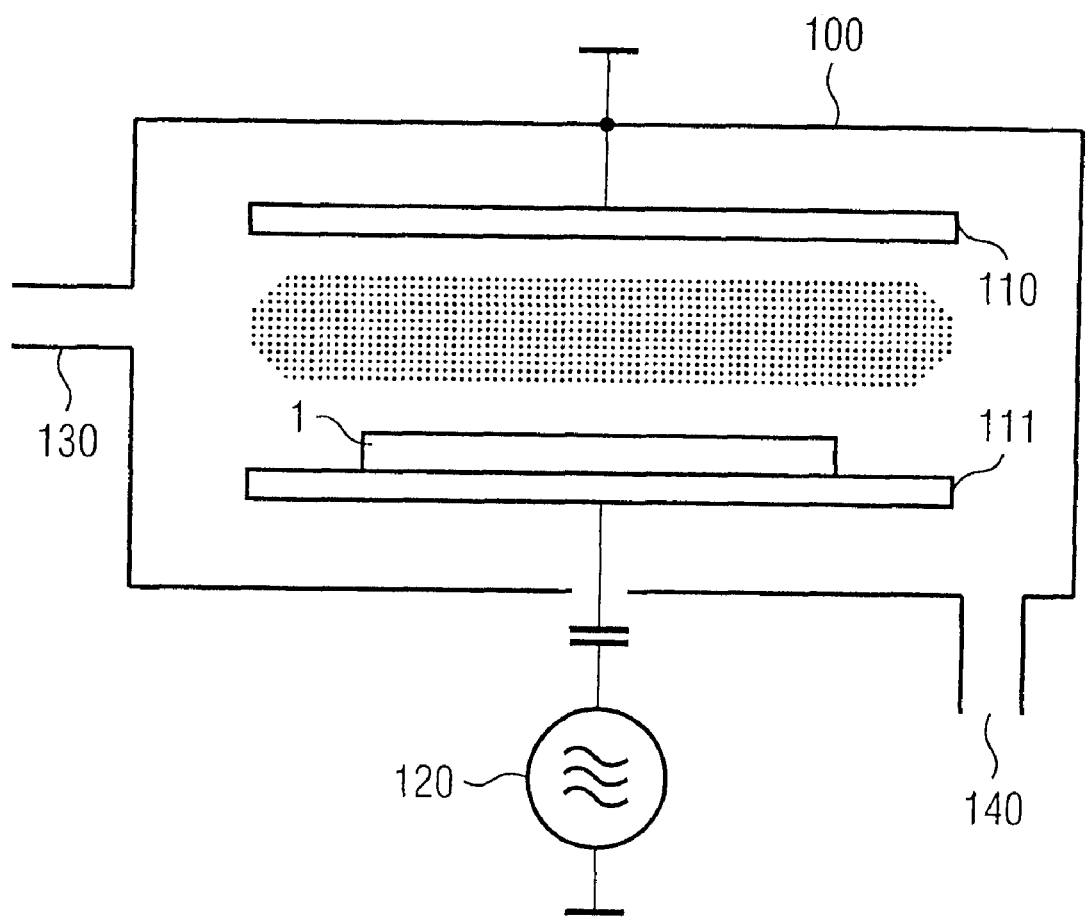
FIG. 4 is a diagram of a process chamber according to the invention.

The integrated process sequence according to the invention for the production of metal/metal contacts as part of a multilayer metallization is illustrated on the basis of the example of a digital CMOS circuit on a semiconductor wafer, describing the way in which a first metallization level is brought into contact with a second metallization level. In the process sequence shown in FIG. 1, the metal used for the interconnects is copper, which is distinguished by a low resistivity and therefore allows high current intensities. FIGS. 1A to 1H show a cross section through a silicon wafer during various process stages involved in the formation of the copper contacts. FIGS. 2 and 3 each compare the process sequence according to the invention with a conventional process sequence, and FIG. 4 shows a possible configuration of a process reactor according to the invention.

Figure 1A:
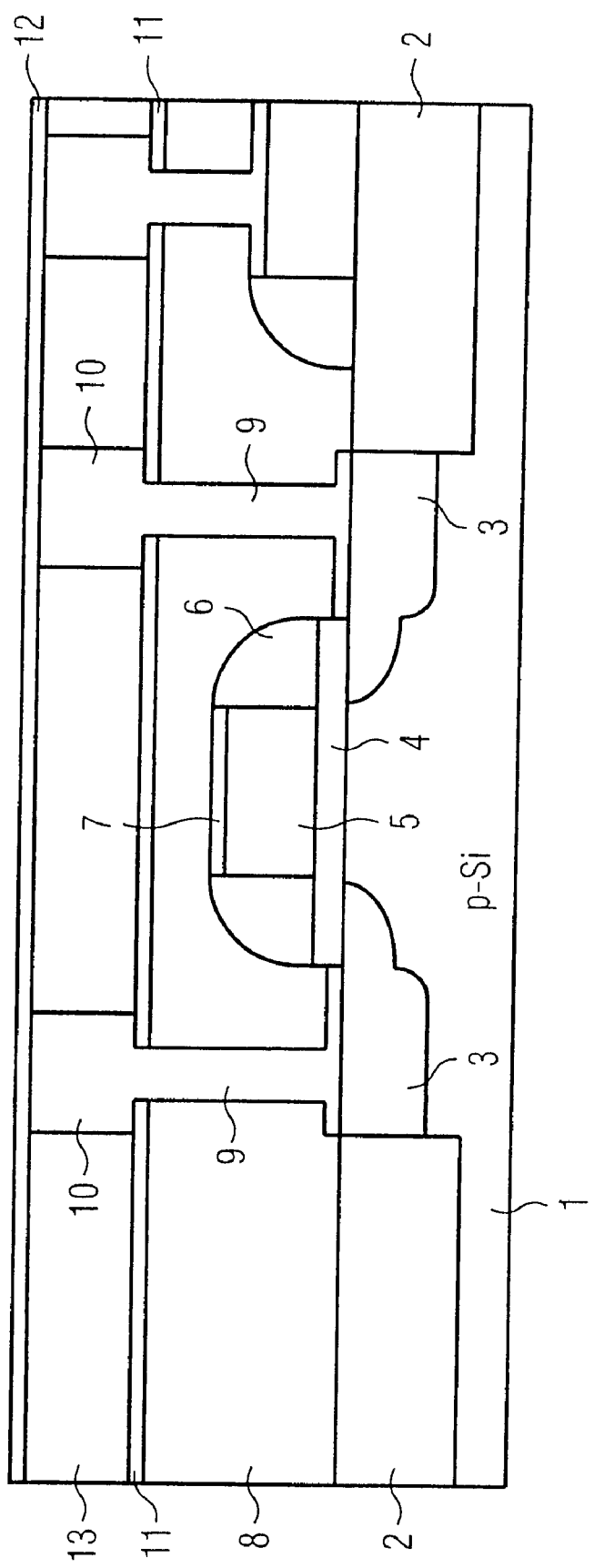

Referring now more specifically to FIG. 1A, there is shown a silicon wafer 1, which is weakly p-doped and in which a field-effect transistor is formed.

The field-effect transistor is laterally delimited by two dielectric layers 2, which consist of $SiO_2$. The field-effect transistor has two strongly n-doped diffusion regions 3, which serve as source and drain electrodes. A dielectric layer 4, preferably of $SiO_2$, is formed so as to overlap these two electrode regions 3, and a conductive gate electrode 5, which consists, for example, of highly doped polysilicon, is positioned on the dielectric layer 4. The gate electrode 5 is delimited by two SiO$_2$ spacers 6 and is connected via an interconnect 7, which preferably consists of tungsten silicide. Furthermore, the entire field-effect transistor is encapsulated in an insulation layer 8, which preferably consists of SiO$_2$. Metal contacts 9 are introduced through this insulation layer 8, making contact with the electrode region 3. The metal contacts 9 are in this case filled with copper and are in each case connected to a copper interconnect 10. These copper interconnects 10 are enclosed between two nitride layers 11, 12, which encapsulate the copper, and, for the purpose of electrical insulation, are surrounded by a dielectric layer 13, preferably of SiO$_2$. A cross section through the silicon wafer following this stage of production is shown in FIG. 1A.

Figure 1B:
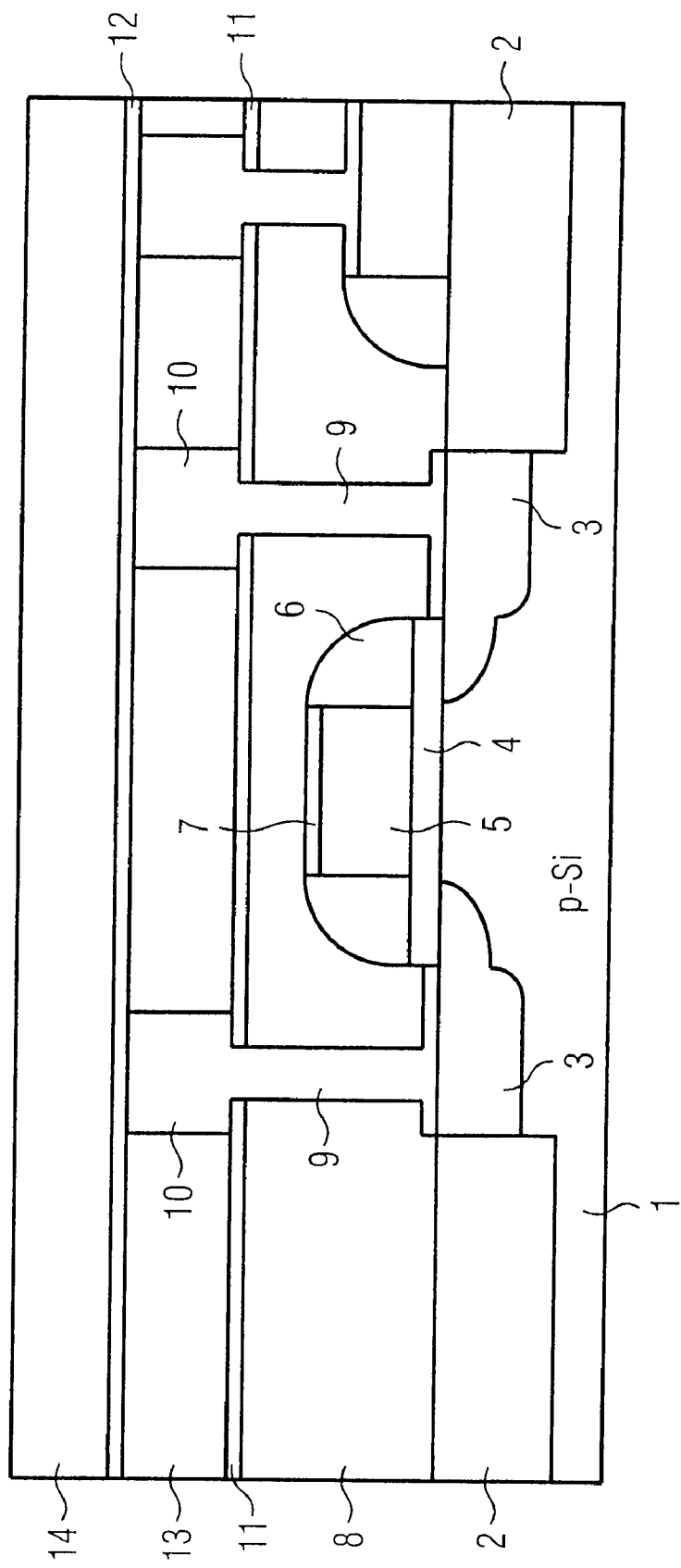

To electrically insulate the first interconnect level 10, a further SiO$_2$ layer 14 is applied to the upper nitride layer 12. A cross section through the silicon wafer following the SiO$_2$ deposition is shown in FIG. 1B.

To form a conductive connection between the first interconnect level 10 of copper and a second interconnect level of copper, in a first process step the lithography technique is then used to define the pattern of the interconnect contacts. In this case, first of all an adhesion promoter is applied to the nitride layer 12, and then the nitride layer 12 is coated with a radiation-sensitive photoresist 15. This photoresist 15 is generally what is known as a positive photoresist and consists of a solid matrix material, a light-sensitive component and a solvent. The matrix material is primarily a phenolic resin.

Figure 1C:
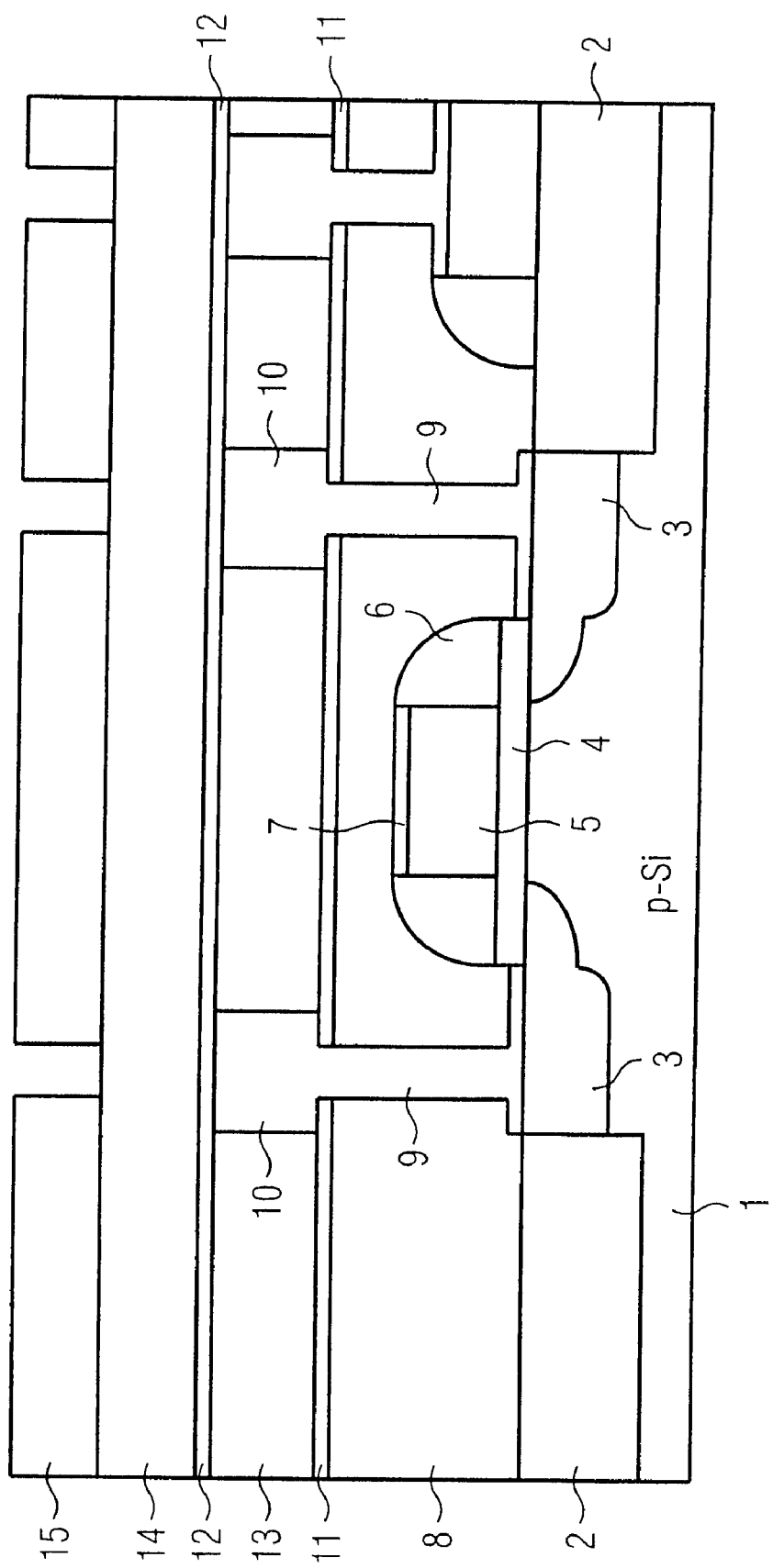

After the coating of the silicon wafer with resist, the solvent is expelled from the photoresist layer 15 by a heating step. Then, the pattern of the contact openings is defined on the photoresist layer 15 by exposure with the aid of a mask or directly by electron beam writing. The photoresist 15 is then developed. During the developing step, using the positive photoresist technique the photoresist is removed at the exposed locations, while the regions, which have not been irradiated remain masked. A cross section through the silicon wafer following this process step is shown in FIG. 1C. In the case of a negative photoresist technique, which is also possible, the exact opposite situation would arise, with the exposed locations being masked while the unexposed resist is removed during the developing. Then, the developing of the photoresist 15 is again followed by a heat-treatment step, in order to cure the photoresist 15.

Then, in a process sequence which follows the lithography process, the contact holes are etched into the SiO$_2$ layer 14, with the photoresist layer 15 being used as a mask, after which the photoresist mask is removed again, and then the nitride layer 12 is etched away at the bottom of the contact holes. All the process operations preferably take place using the dry-etching technique, in which the material is removed by atoms or molecules of a gas and/or by bombarding ions, photons or electrons onto the surface which is to be etched. In this case, the entire process sequence is carried out in a single process chamber, which is part of a metal-deposition installation, so that integrated process management without interruption to the vacuum is possible.

A reactor with a process chamber according to the invention is shown in FIG. 4. The process chamber is preferably connected directly to a metal deposition installation, in order to enable the semiconductor wafer to be transported out of the process chamber into the metal-deposition installation without interruption to the vacuum. The process chamber comprises a closed vessel 100, a pair of electrodes 110, 111, which are connected to a high-frequency generator 120, an inlet 130 for the etching gas and a connection 140 for the vacuum pump. The lower electrode 111 of the electrodes, which are preferably arranged parallel to one another, simultaneously serves as a mount for the semiconductor wafer 1 which is to be etched. The process chamber shown can be used to carry out both a chemical dry etch, in which a chemical reaction takes place between neutral particles of a gas and atoms of the surface which is to be etched, and a chemical-physical dry etch, in which the chemical etching reaction is assisted by a physical etching process which is brought about by bombarding with ions, electrons or photons. The chemical-physical etching process is preferably used for the anisotropic etching of the contact holes into the SiO$_2$ layer and the subsequent cleaning of the contact holes so as to remove organic impurities, whereas the chemical etching process is used to etch the photoresist layer off the surface.

To carry out the etching, the reactor chamber is evacuated and then a suitable etching gas is supplied. A chemical etching operation is in this case carried out using an excited gas, the gas being converted into a plasma in the supply tube through the application of a high-frequency voltage (not shown). This plasma is fed into the chamber 100 via the inlet 130. Excited neutral atoms or molecules diffuse out of the plasma, which has been fed in, to the semiconductor wafer 1, and react chemically with the atoms on the wafer surface. The reaction products are then extracted via the connection 140 with the aid of a vacuum pump. In the case of chemical dry etching, the etching process is direction-independent, so that an isotropic etching profile is formed.

In the case of chemical-physical dry etching, the etching gas is fed in via the feed 130 and a glow discharge is then generated through the application of a high-frequency voltage to the two electrodes 110, 111 via the high-frequency generator 120, leading to the formation of a low-pressure and low-temperature plasma comprising ions, electrons and excited neutral particles. Since the electrons in the high-frequency field accumulate more rapidly on the electrodes, these electrodes are in the process negatively charged and therefore attract the positive ions from the plasma. These vertically impinging ions then initiate a chemical etching reaction on the wafer surface, leading to the formation of an anisotropic etching profile. The etching products are once again extracted by the vacuum pump via the connection 140.

In the process chamber shown in FIG. 4, the reactive ion etching technique, in which the high-frequency voltage is capacitively applied to the lower electrode 111, is used for the chemical-physical dry etching. The upper electrode 110 is connected to the reaction chamber 100 and grounded. Together with the reaction chamber 100, the upper electrode 110 in this way forms a larger surface than the lower electrode, which leads to the lower electrode being more strongly negatively charged by the impinging electrons. On the way to the semiconductor wafer, which is being etched, the ions from the plasma acquire a sufficiently great chemical energy to initiate the chemical etching reactions. Furthermore, the gas pressure in the reaction chamber can be kept at a relatively low level, so that the ions scarcely collide and therefore arrive substantially perpendicularly at the surface which is to be etched, therefore transferring the pattern of the mask accurately to the layer below it on the semiconductor wafer. However, instead of reactive ion etching, it is also possible to use other known plasma etching techniques for chemical-physical dry etching, such as for example magnetically enhanced reactive ion etching, triode reactive ion etching or inductively coupled plasma etching. It is also possible to use a very wide range of plasma or ion sources, such as the Kaufmann source, the ECR source, the inductively coupled source or the helicon source. Furthermore, in the case of chemical dry etching, in addition to exciting the etching gas in the inlet 130 by means of a high-frequency voltage, it is also possible to generate a plasma by introducing microwaves in the inlet 130 through which the gas flows.

For the purpose of etching the contact holes 17 into the SiO$_2$ layer 14 on the silicon wafer 1, the silicon wafer, after it has been introduced into the reactor chamber 100, is anisotropically etched by a first reactive ion etching step, the photoresist layer 15 serving as the etching mask. SiO$_2$ is generally etched using a fluorine-containing gas, which is selective with respect to the nitride layer 12 below. Furthermore, to improve the etching, additives, such as for example H$_2$, O$_2$, CH$_4$, etc., are added to the fluorine-containing etching gas. The silicon wafer after this etching step is shown in FIG. 1D. However, undesired polymer deposits 16, which form from the reaction products of the etching operation remain in the contact holes 17.

After the etching of the contact holes, the remaining photoresist layer 15, which was used as the mask, is removed again. For this purpose, a dry-chemical etching away process is carried out, which ensures isotropic etching of the photoresist layer 15. In this case, the etching gas used is preferably oxygen, if appropriate with additives. This isotropic etching operation once again gives rise to polymer deposits 16 in the contact hole openings 17, as shown by the cross section through the silicon wafer shown in FIG. 1E.

These polymer deposits 16 are removed by a further reactive ion etching step. For this purpose, oxygen is once again preferably used as the etching gas, with a noble gas, preferably argon, generally being added in order to stabilize the plasma. In this case, the remaining SiO$_2$ layer 14 serves as an etching mask. A cross section through the silicon wafer 1 after this further reactive ion etching process is shown in FIG. 1F.

Then, the remaining nitride layer 12 at the bottom of the contact holes is opened up, likewise by means of a reactive ion etching step, in order in this way to create access to the copper interconnects. In this case too, a fluorine-containing gas is preferably used for the etching. A cross section through the silicon wafer following this process step is shown in FIG. 1G.

The entire etching sequence following the etching of the contact holes into the SiO$_2$ layer 14, i.e. the removal of the photoresist mask 15 and the elimination of the nitride layer 12 at the bottom of the contact holes are carried out in the reaction chamber 100 without interruption to the vacuum. Since the reaction chamber 100 is part of the metal-deposition installation, this vacuum is also not interrupted for the metal deposition, which follows. This prevents films of moisture from forming on the wafer surface during transport and storage in air, which could lead to oxidation in the contact hole opening and would then have to be removed by an additional cleaning step. Therefore, the integrated process sequence makes it possible to dispense with complex and expensive additional cleaning steps of this type. The integrated process management in a common reaction chamber also reduces the out lay involved in carrying out the individual process steps significantly, since it is possible to eliminate both separate equipment and additional installation surfaces in the clean room.

Then, as shown in FIG. 1H, after the etching processes have finished, the contact holes 17 are filled with copper, a layer sequence of Ta and TaN being applied prior to the deposition of copper, this layer sequence serving as a diffusion barrier and a nucleation layer for the subsequent deposition of copper. Then, after the copper deposition has ended, one of the known methods is used to pattern this copper layer so as to form further interconnects.

FIG. 2 shows a comparison of the conventional standard process sequence and the integrated process sequence according to the invention for copper metallization. In the standard process sequence, all the etching steps are carried out in independent etching chambers, and argon sputtering cleaning of the preheated wafer is carried out prior to the deposition of copper, in order to remove oxide layers which form in the contact hole openings. In the integrated process sequence according to the invention, the heating step and the subsequent sputter cleaning can be eliminated.

FIG. 3 shows a further comparison of a conventional process sequence and the integrated process sequence according to the invention, in which the metallization is carried out using aluminum. When forming the interconnects using aluminum, it is possible to dispense with a nitride layer for encapsulation of the interconnects as is used in the case of copper. In the conventional methods, however, an additional wet-chemical cleaning step is carried out after the chemical dry etching of the photoresist layer, in order to remove polymers, which form. According to the invention, this process step is replaced by reactive ion etching (MERIE=magnetically enhanced reactive ion plasma etch) in the same vacuum installation, which has the advantage that there are no oxide layers formed in the contact hole openings, since these layers then have to be removed by an additional argon sputtering process prior to the aluminum deposition.

Furthermore, it is within the scope of the invention, over and above the exemplary embodiments illustrated, for in particular the materials and processes which have been listed to be modified in a suitable way in order, according to the invention, to produce a metal/metal contact as part of a multilayer metallization in integrated circuits on a semiconductor wafer. In particular, it is possible to use known process sequences to form multilayer metallizations for integrated circuits. To implement the invention in its various configurations, the features of the invention, which are disclosed in the above description, the drawings and the claims may be of importance either individually or in any appropriate combination.

We claim:

1. A method for producing a metal/metal contact as part of a multilayer metallization in an integrated circuit on a semiconductor wafer, which comprises the following method steps:

applying an insulation layer to a metal plane;

carrying out a photolithography step using a photoresist mask to define contact holes on the insulation layer;

anisotropically etching the insulation layer to produce contact holes; and without interrupting a vacuum:
    removing the photoresist mask by chemical dry etching; and
    removing organic impurities accumulated during the dry etching step by chemical-physical dry etching; and
    depositing metal to fill the contact holes.

2. The method according to claim 1, wherein the step of chemical dry etching to eliminate the photoresist mask is carried out with an etching gas excited to form a plasma through application of a high-frequency voltage or by the introduction of microwaves.

3. The method according to claim 1, wherein the step of chemical-physical dry etching to eliminate the inorganic impurities is carried out by a reactive ion etching technique.

4. The method according to claim 1, wherein the etching gas used in the chemical dry etching step is oxygen.

5. The method according to claim 1, wherein the metallization is a copper metallization and, the method further comprises, following the chemical-physical dry etching for eliminating the organic impurities, carrying out a further chemical-physical dry-etching step in the vacuum for removing a nitride layer at a bottom of the contact holes.

* * * * *